United States Patent
Dohata

(10) Patent No.: US 7,154,353 B2
(45) Date of Patent: Dec. 26, 2006

(54) MICROSTRIP LINES IN A MULTI-LAYERED SHIELDED CONFIGURATION

(75) Inventor: Hiroyuki Dohata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 38 days.

(21) Appl. No.: 11/043,978

(22) Filed: Jan. 28, 2005

(65) Prior Publication Data

US 2005/0206467 A1   Sep. 22, 2005

(30) Foreign Application Priority Data

Feb. 5, 2004   (JP)   ............... 2004-029180

(51) Int. Cl.
*H01P 3/08* (2006.01)
(52) U.S. Cl. .......................... 333/1; 333/238
(58) Field of Classification Search ............ 333/1, 333/238
See application file for complete search history.

(56) References Cited

U.S. PATENT DOCUMENTS 4,130,723 A * 12/1978 Wakeling ............... 174/36
4,680,557 A * 7/1987 Compton ............... 333/1
4,864,722 A * 9/1989 Lazzarini et al. ........ 29/830
6,040,524 A * 3/2000 Kobayashi et al. ...... 174/36

FOREIGN PATENT DOCUMENTS

JP   9-266370 A   10/1997
JP   2002-164701 A   6/2002

* cited by examiner

*Primary Examiner*—Benny Lee
(74) *Attorney, Agent, or Firm*—Birch, Stewart, Kolasch & Birch, LLP

(57) ABSTRACT

A plurality of signal lines are provided on one main surface of a dielectric substrate. A plurality of other signal lines are provided on the other main surface of dielectric substrate. The plurality of signal lines on one main surface and the plurality of other signal lines on the other main surface are provided so as to extend in parallel to one another. A ground pattern having its potential fixed is provided between neighboring signal lines on one main surface, and a ground pattern having its potential fixed is provided between neighboring signal lines on the other surface. According to such a structure, a microstrip line that can include a larger number of signal lines on the main surfaces of the dielectric substrate, without increasing a size of the dielectric substrate is obtained.

1 Claim, 8 Drawing Sheets

MICROSTRIP LINES IN A MULTI-LAYERED SHIELDED CONFIGURATION

This nonprovisional application is based on Japanese Patent Application No. 2004-029180 filed with the Japan Patent Office on Feb. 5, 2004, the entire contents of which are hereby incorporated by reference.

FIELD OF THE INVENTION

The present invention relates to a microstrip line having a signal line and a ground conductive layer opposed to each other with a dielectric substrate being interposed.

DESCRIPTION OF THE BACKGROUND ART

Improvement in satellite broadcasting service has recently be demanded. Accordingly, the number of channels used for satellite broadcasting has increased. A single LNB (Low Noise Block Downconverter) receives radio waves transmitted from respective ones of a plurality of satellites. In addition, a circuit such as an LNB including a plurality of output terminals for tuning serving for connection to a tuner and an SW (Switch)-BOX including a plurality of input ports and output ports for IF (Intermediate Frequency) has a complicated structure.

In an SW-BOX in which a microstrip line is shielded by a chassis 300 and a frame 200 as shown in FIG. 7, a larger number of signal lines should be provided on a dielectric substrate 01, than in a conventional example.

When a large number of signal lines 102a, 102b, and 102c are provided on one main surface of dielectric substrate 101 as shown in FIG. 8, a problem of electro-magnetic interference between signal lines 102a and 102b as well as electro-magnetic interference between signal lines 102c and 102b arises. In order to suppress the electro-magnetic interference among signal lines and in order to prevent electro-magnetic interference of an external electro-magnetic wave to the signal line, conductive layers attaining a function as ground such as ground patterns 103a, 103b, 103c, and 103d in FIG. 8 are provided. Ground patterns 103a and 103d are provided in order to prevent the electro-magnetic interference of the external electro-magnetic wave to the signal line. Ground patterns 103a, 103b, 103c, and 103d are connected to a ground pattern 50 through a plurality of plugs (such as through holes) 104 penetrating dielectric substrate 101, so that potentials of the ground patterns are fixed to a prescribed level.

In the microstrip line as described above, further increase in the number of signal lines has been desired. To that end, the ground pattern should have a further smaller width. On the other hand, if the width of the ground pattern is too small, the ground pattern will no longer be able to suppress the electromagnetic interference among the signal lines, and accordingly, the width of the ground pattern cannot be made smaller. Instead, an area of the main surface of the dielectric substrate should be increased. Increase in a size of the dielectric substrate, however, is contrary to the demand for a smaller size of the microstrip line.

SUMMARY OF THE INVENTION

The present invention was made to solve the above-described problems. An object of the present invention is to provide a microstrip line that can include a larger number of signal lines without increasing a size of the dielectric substrate.

A microstrip line according to one aspect of the present invention includes at least two signal lines extending in parallel to one another, and a dielectric substrate having one main surface and the other main surface. At least two signal lines are provided such that at least one signal line is present on one main surface and the other main surface respectively.

According to the structure above, when two signal lines are provided respectively on one main surface and the other main surface, the dielectric substrate is present between the two signal lines, and a large ground conductive layer can be provided on each of one main surface and the other main surface of the substrate. Accordingly, prevention of electro-magnetic interference between two signal lines can further be ensured.

If three or more signal lines are distributed on one main surface and the other main surface, for example, an interval between signal lines on one main surface can be larger than in a microstrip line where two or more signal lines are provided solely on one main surface. Consequently, the ground conductive layer provided between neighboring signal lines can have a larger width. Accordingly, suppression of electro-magnetic interference between the neighboring signal lines can be ensured without increasing an area of the main surface of the dielectric substrate. Accordingly, a microstrip line that includes a larger number of signal lines without increasing a size of the dielectric substrate can be provided.

Preferably, at least two signal lines described above are provided alternately on one main surface and on the other main surface in a direction in which the dielectric substrate extends, when viewed in a cross section perpendicular to at least two signal lines.

According to the structure above, when one signal line is provided on each of one main surface and the other main surface, a size of the ground conductive layer can be smaller than in the microstrip line structured such that two signal lines are provided solely on one main surface. Accordingly, prevention of the electro-magnetic interference between two signal lines can further be ensured, while attaining a smaller area of the main surface of the dielectric substrate.

If four or more signal lines are distributed on one main surface and the other main surface, for example, an interval between signal lines can be substantially identical on a layer on one main surface and on a layer on the other main surface respectively. In other words, a width of a ground conductive layer provided between the signal lines can be substantially identical. Consequently, electro-magnetic interference can be suppressed equally with regard to respective combinations of neighboring signal lines, on the layer in one main surface and on the layer in the other main surface respectively.

Preferably, when a plurality of signal lines are provided on the other main surface, the plurality of signal lines are opposed to one ground conductive layer on one main surface, with the dielectric substrate being interposed.

According to the structure above, as compared with a microstrip line in which one signal line is opposed to one ground conductive layer on one-to-one basis, a conductive layer on one main surface can have a width larger than that of another connection conductor. Accordingly, electro-magnetic interference between the signal lines provided so as to opposite each of side surfaces of the ground conductive layer on one main surface can be suppressed in a more ensured manner than electro-magnetic interference between other signal lines.

A microstrip line according to another aspect of the present invention includes: at least two signal lines extending in parallel to one another; a first dielectric substrate; and a second dielectric substrate provided in parallel to the first dielectric substrate. At least two signal lines are distributed in any at least two layers out of a layer on an outer main surface of the first dielectric substrate, a layer lying between the first dielectric substrate and the second dielectric substrate, and a layer on an outer main surface of the second dielectric substrate.

According to the structure above, the signal lines are distributed in any two layers out of the three layers. Accordingly, as compared with the microstrip line in which all of the plurality of signal lines are provided solely in any one of the layers on the main surfaces of one dielectric substrate, suppression of electro-magnetic interference between the signal lines can further be ensured, without increasing an area of the main surface of the dielectric substrate. Therefore, a microstrip line that includes a larger number of signal lines without increasing a size of the dielectric substrate can be provided.

A microstrip line according to yet another aspect of the present invention includes at least three signal lines. Desirably, at least three signal lines are provided such that at least one signal line is present in respective ones of the layer on the outer main surface of the first dielectric substrate, the layer lying between the first dielectric substrate and the second dielectric substrate, and the layer on the outer main surface of the second dielectric substrate. Then, the three layers as above can effectively be utilized.

In addition, preferably, in the microstrip line including three or more layers and having three or more signal lines, any two signal lines in proximity are provided respectively in any two layers out of the layer on the outer main surface of the first dielectric substrate, the layer lying between the first dielectric substrate and the second dielectric substrate, and the layer on the outer main surface of the second dielectric substrate.

When two specific signal lines are provided adjacent to each other in one layer, an interval between the adjacent specific signal lines may extremely be smaller than an interval between other adjacent signal lines. Such a disadvantage is avoided if the microstrip line as described above is employed.

Preferably, when a plurality of signal lines that are adjacent are provided in any at least one layer out of the layer on the outer main surface of the first dielectric substrate, the layer lying between the first dielectric substrate and the second dielectric substrate, and the layer on the outer main surface of the second dielectric substrate, the plurality of signal lines are opposed to one ground conductive layer with the first dielectric substrate or the second dielectric substrate being interposed.

According to the structure above, as compared with a microstrip line in which one signal line is opposed to one ground conductive layer on one-to-one basis, a ground conductive layer between a plurality of specific signal lines that are adjacent can have a width larger than that of another ground conductive layer between other adjacent signal lines. Accordingly, electro-magnetic interference between the adjacent, specific signal lines can be suppressed in a more ensured manner than electro-magnetic interference between other adjacent signal lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A microstrip line in embodiments of the present invention will be described hereinafter with reference to the drawings.

First Embodiment

Figure 2:
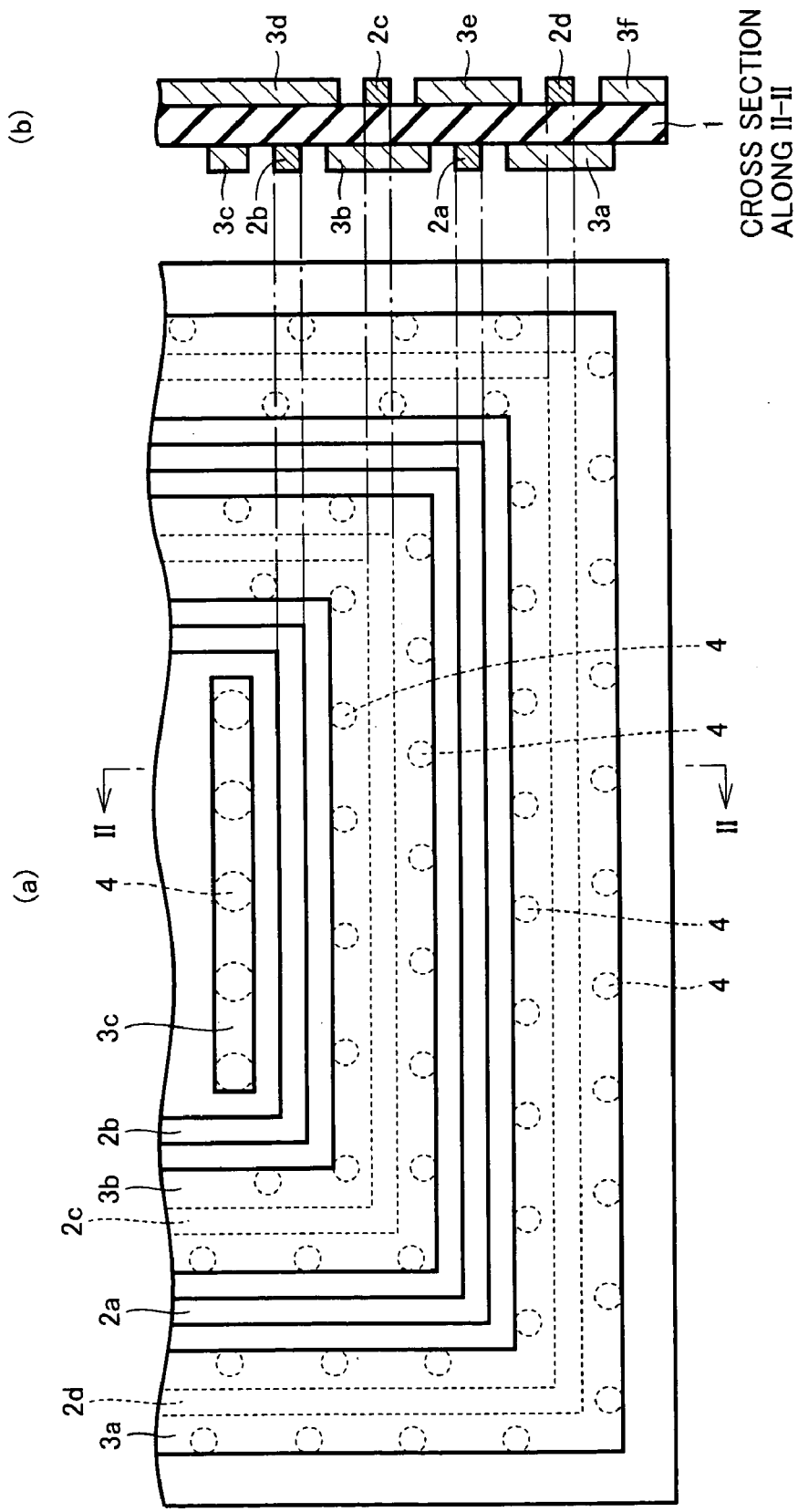
FIG. 2 illustrates another microstrip line in the first embodiment.
Figure 3:
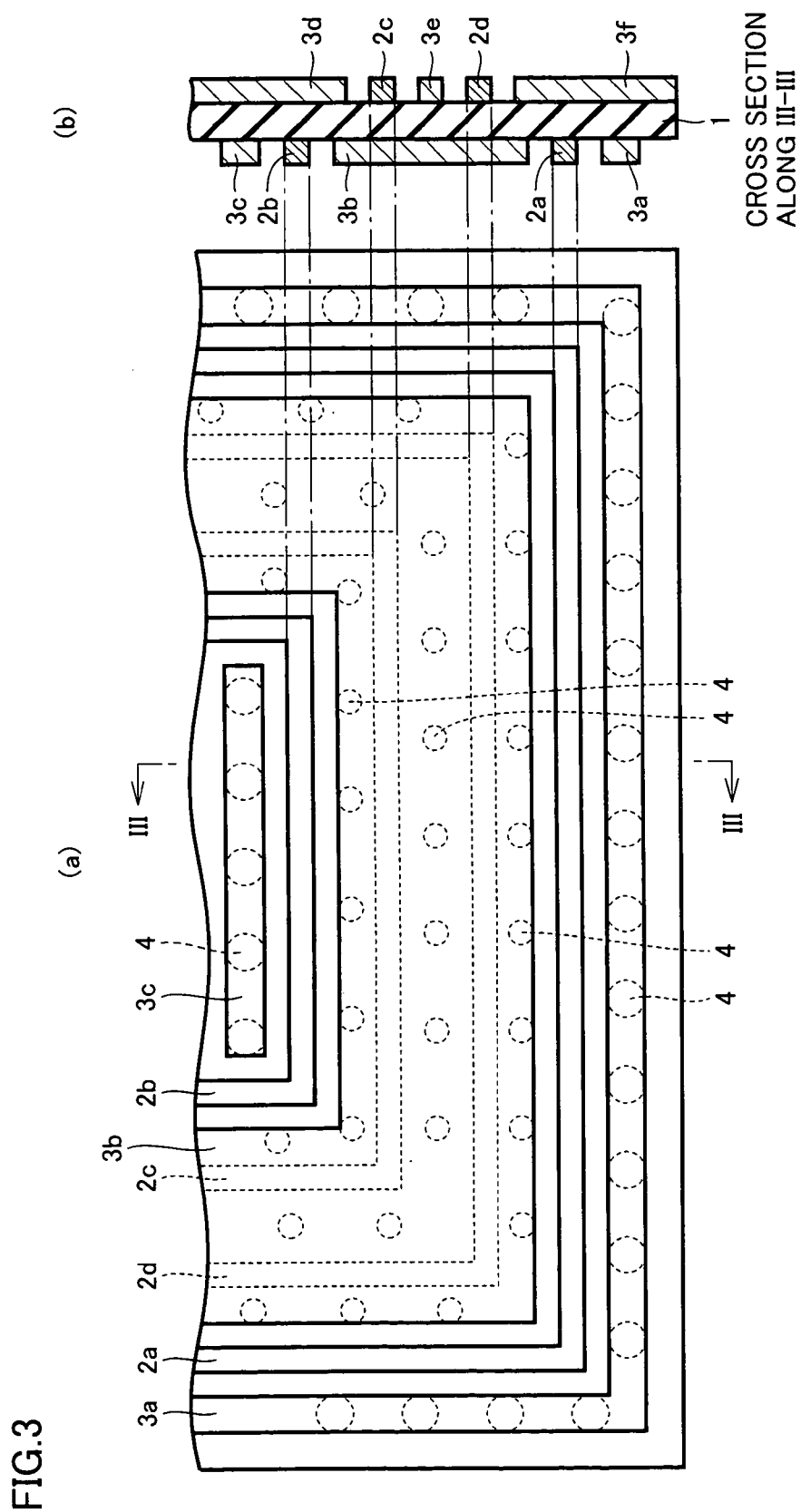
FIG. 3 illustrates yet another microstrip line in the first embodiment.

A microstrip line according to the first embodiment will be described with reference to FIGS. 1 to 3. It is noted that FIGS. 1 to 3 show top views of the microstrip line respectively; section (b) in FIG. 1 shows a cross-sectional view along the line I—I in section (a) in FIG. 1; section (b) in FIG. 2 shows a cross-sectional view along the line II—II in section (a) in FIG. 2; and section (b) in FIG. 3 shows a cross-sectional view along the line III—III in section (a) in FIG. 3.

Figure 1:
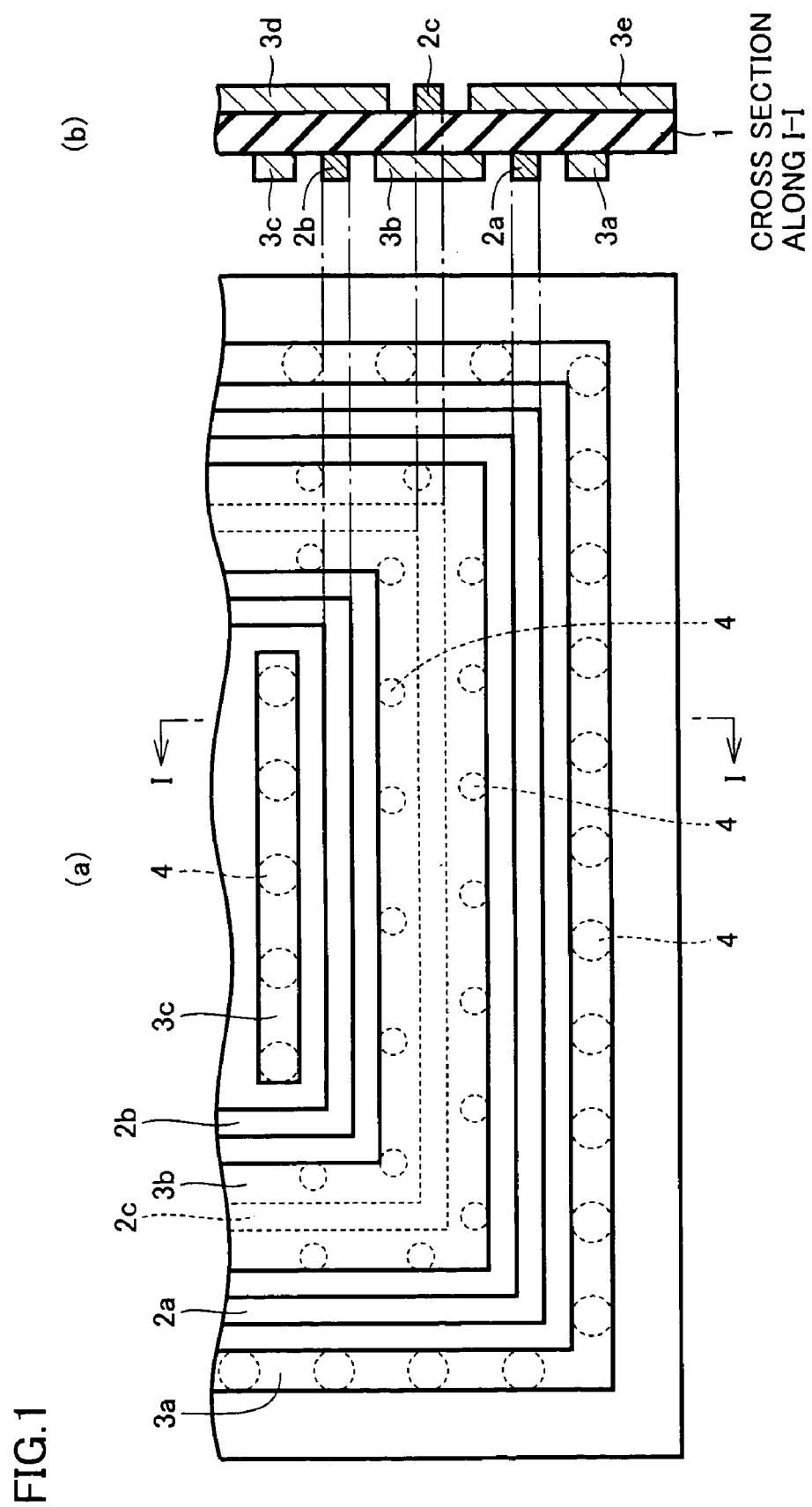
FIG. 1 illustrates a microstrip line in a first embodiment.

The microstrip line shown in FIG. 1 according to the present embodiment includes a dielectric substrate 1. A signal line 2a and a signal line 2b are provided on one main surface of dielectric substrate 1. Signal line 2a and signal line 2b are parallel to each other. In addition, ground patterns 3a, 3b, and 3c are provided on one main surface of dielectric substrate 1, in parallel to signal line 2a and signal line 2b respectively.

A signal line 2c is provided on the other main surface of dielectric substrate 1. Signal line 2c extends in parallel to each signal line 2a and 2b. Signal line 2c is provided in a position on dielectric substrate 1, opposite to a position where ground pattern 3b is provided. In addition, on the other main surface of dielectric substrate 1, a ground pattern 3d is provided so as to opposite to one side surface of signal line 2c, while a ground pattern 3e is provided so as to opposite to the other side surface of signal line 2c. Signal line 2b is provided in a position on dielectric substrate 1, opposite to a position where ground pattern 3d is provided. Signal line 2a is provided in a position on dielectric substrate 1, opposite to a position where ground pattern 3e is provided.

Ground patterns 3a, 3b, 3c, 3d, and 3e are electrically connected to one another by a plurality of plugs (such as through holes) 4 penetrating dielectric substrate 1, so as to implement one conductor.

It is noted that ribs of a conductor cover for electrically shielding the microstrip line from the outside may be connected to ground patterns 3a, 3b, 3c, 3d, and 3e respectively.

According to the microstrip line in the present embodiment as described above, as compared with the microstrip line in which three signal lines 2a, 2b, and 2c are collectively provided solely on one main surface of dielectric substrate 1, an interval between signal lines 2a and 2b can be larger. Accordingly, ground pattern 3b can have a larger width. Consequently, possibility of electro-magnetic interference between signal lines 2a and 2b is further reliably reduced. If the rib of the conductor cover for shielding is connected to ground pattern 3b, the rib having a larger width can be connected to ground pattern 3b. As a result, prevention of electro-magnetic interference between signal lines 2a and 2b can further be ensured. Moreover, prevention of electro-magnetic interference between signal lines 2a and 2c as well as electro-magnetic interference between signal lines 2b and 2c can further be ensured.

FIG. 2 illustrates another microstrip line in the present embodiment.

The structure of the microstrip line shown in FIG. 2 is substantially similar to that of the microstrip line shown in FIG. 1. As portions having the same reference numerals attain substantially similar functions in respective structures shown in FIGS. 1 and 2, description thereof will not be repeated.

The microstrip line shown in FIG. 2 is different from the microstrip line shown in FIG. 1 in that a ground pattern 3f is provided on the other main surface of dielectric substrate 1 and that a signal line 2d is provided between ground patterns 3e and 3f. Signal line 2d extends in parallel to each signal line 2a, 2b, and 2c. In addition, signal line 2d is provided in a position on dielectric substrate 1, opposite to a position where ground pattern 3a is provided.

The microstrip line shown in FIG. 2 has a plurality of signal lines arranged on one main surface and the other main surface of dielectric substrate 1 respectively. In addition, signal lines 2a, 2b, 2c, and 2d are arranged alternately on one main surface and on the other main surface in a direction in which dielectric substrate 1 extends, when viewed in the cross section along the line II—II. Moreover, respective ground patterns are provided in positions on dielectric substrate 1 opposite to positions on dielectric substrate 1 where the plurality of signal lines are provided respectively.

According to another microstrip line in the present embodiment as above, a plurality of signal lines can be arranged in high density on one main surface and on the other main surface of dielectric substrate 1 respectively.

FIG. 3 illustrates yet another microstrip line in the present embodiment. As portions having the same reference numerals attain substantially similar functions in respective structures shown in FIGS. 1 and 2, description thereof will not be repeated.

In the structure shown in FIG. 3, signal lines 2c and 2d are opposed to one ground pattern 3b, with dielectric substrate 1 being interposed. Therefore, an interval between signal lines 2a and 2b in the structure shown in FIG. 3 is larger than that between signal lines 2a and 2b in the structure shown in FIG. 2, and an interval between signal lines 2c and 2d in the structure shown in FIG. 3 is smaller than that between signal lines 2c and 2d in the structure shown in FIG. 2. In addition, signal line 2a is opposed to ground pattern 3f, with dielectric substrate 1 being interposed. The microstrip line having such a structure shown in FIG. 3 is effective when it is necessary to reliably prevent solely electro-magnetic interference between signal lines 2a and 2b, for example.

Second Embodiment

Figure 5:
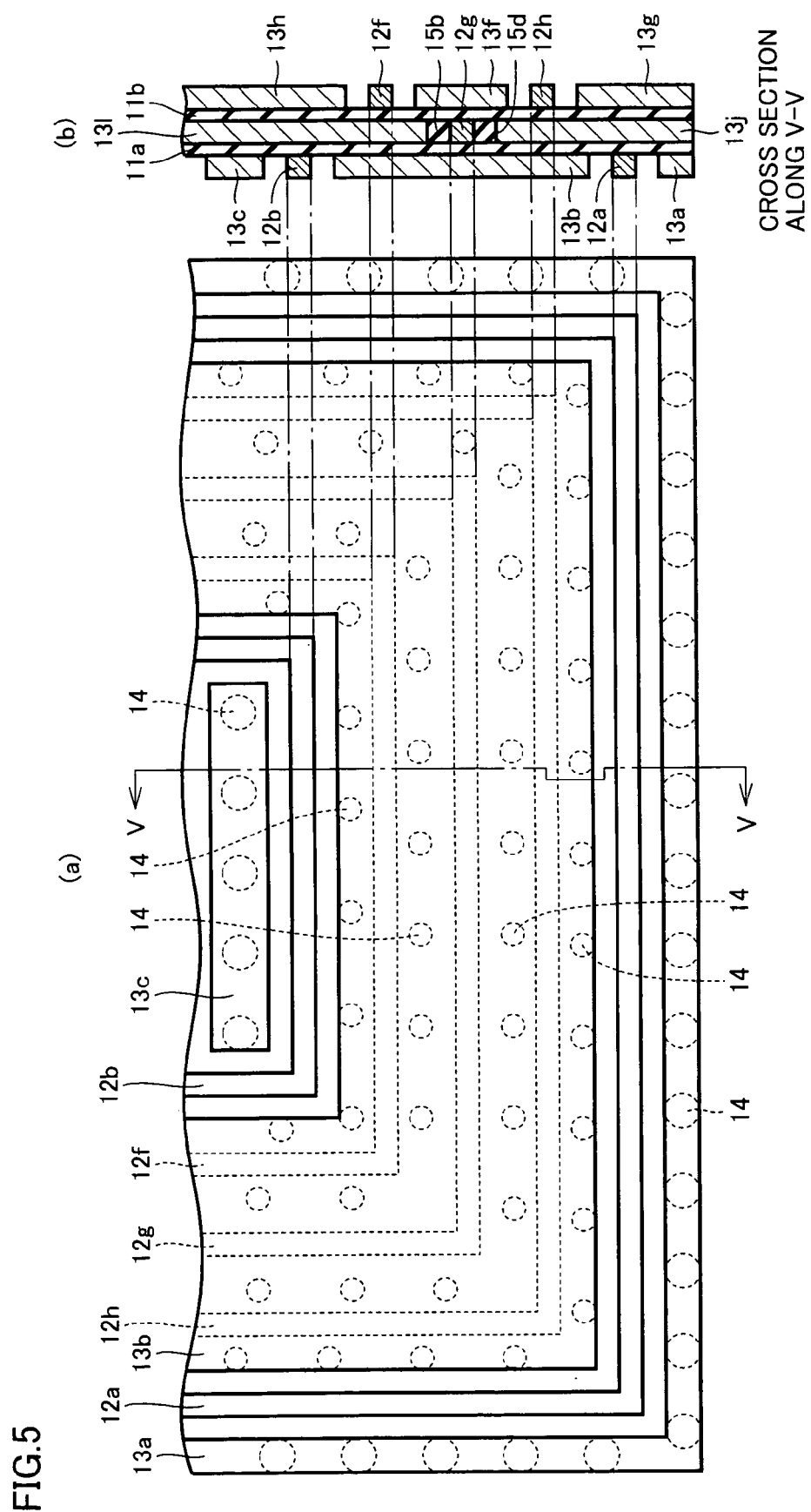
FIG. 5 illustrates another microstrip line in the second embodiment.
Figure 6:
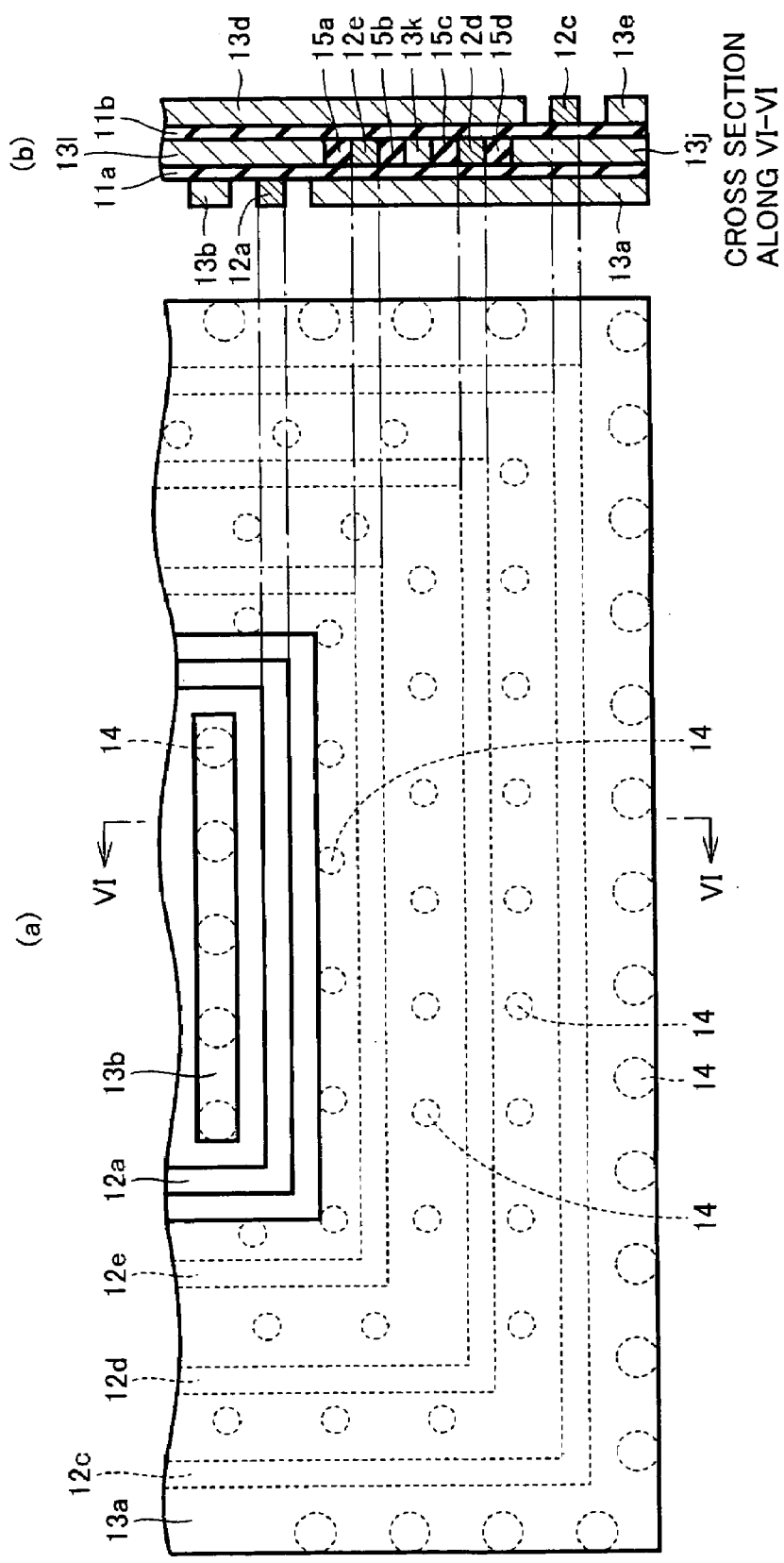
FIG. 6 illustrates yet another microstrip line in the second embodiment.
Figure 7:
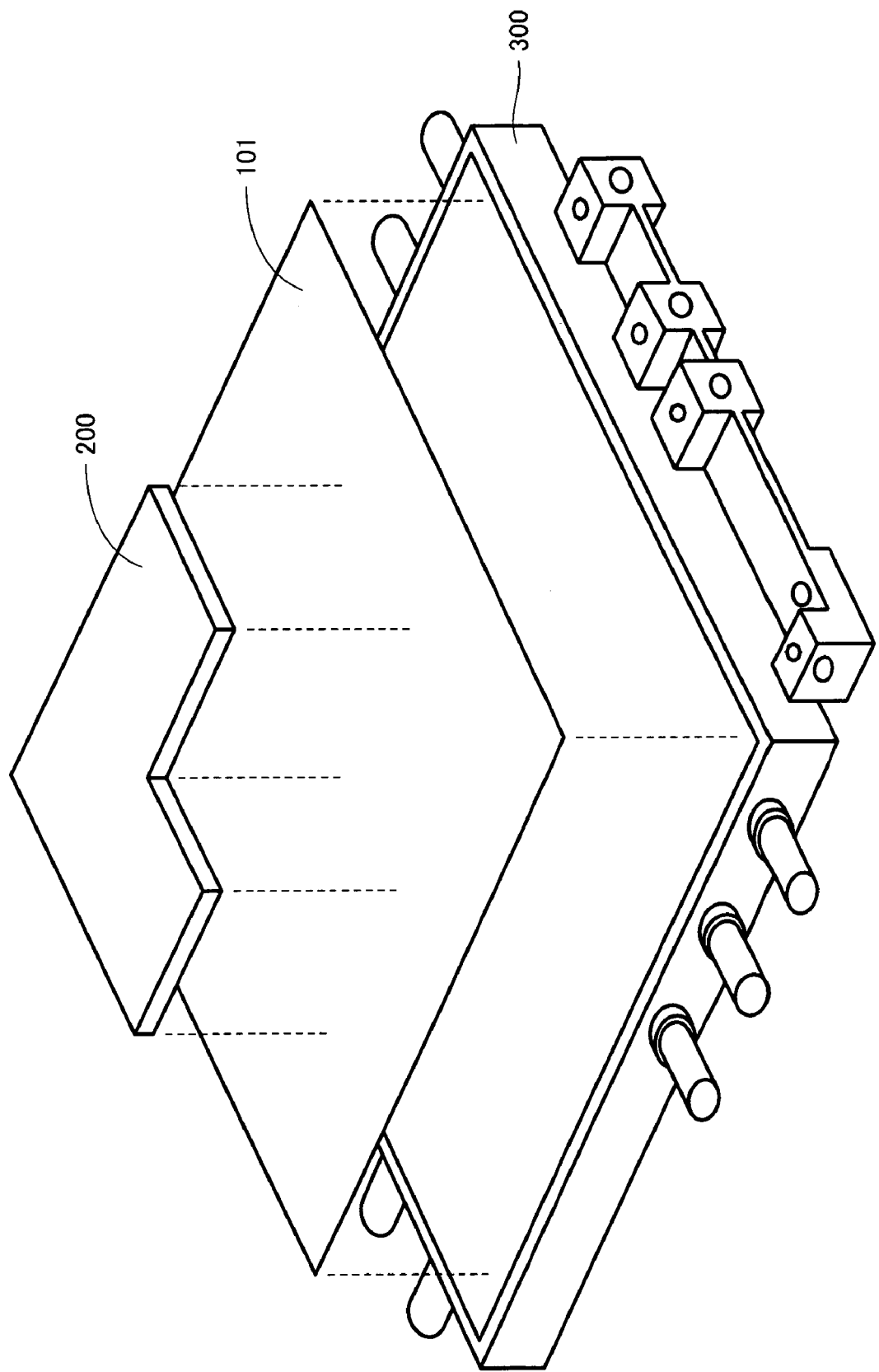
FIG. 7 illustrates an apparatus using a conventional microstrip line.
Figure 8:
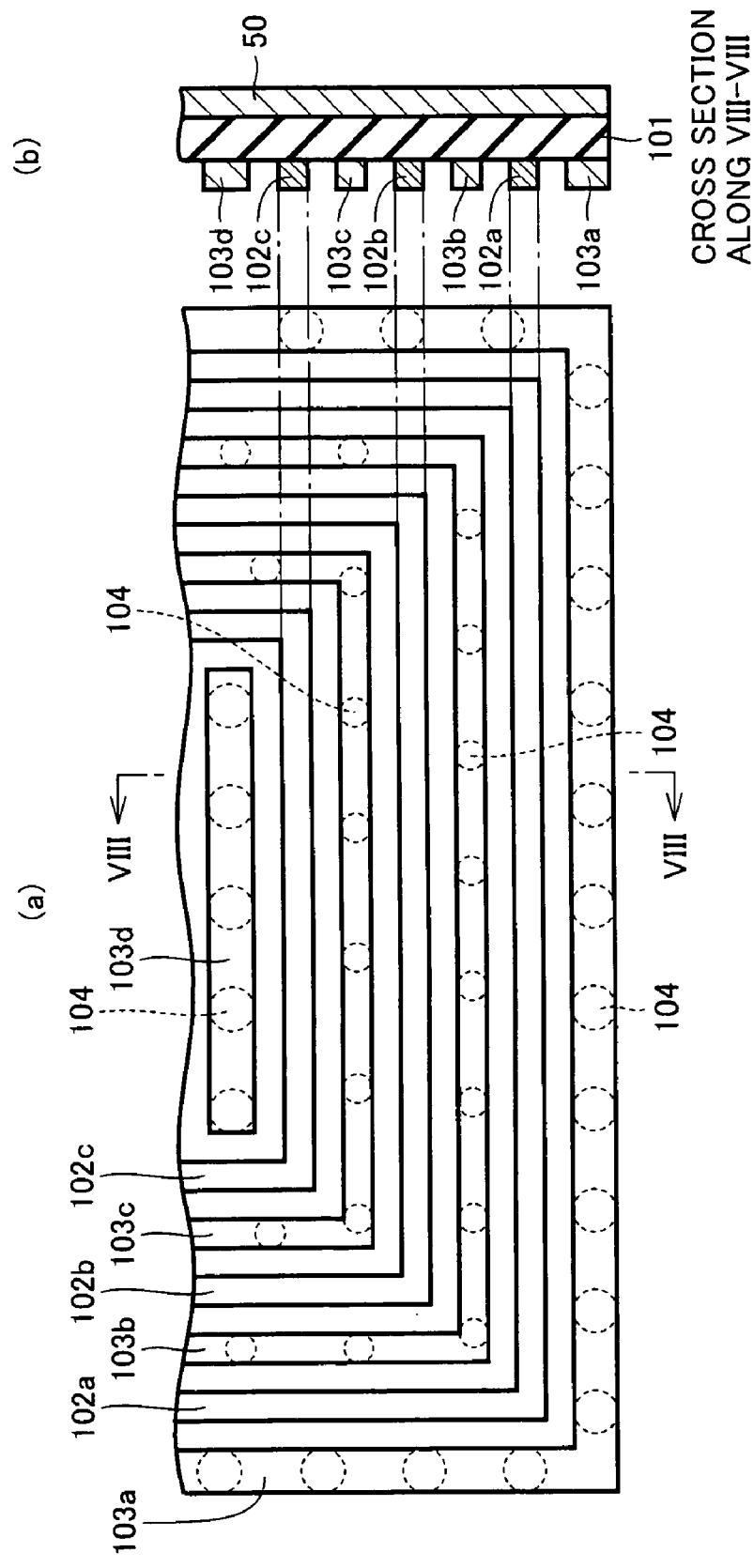
FIG. 8 illustrates a structure of the conventional microstrip line.

A microstrip line in the second embodiment will be described with reference to FIGS. 4 to 6. It is noted that sections (a) in FIGS. 4 to 6 show top views of the microstrip line respectively; section (b) in FIG. 4 shows a cross-sectional view along the line IV—IV in section (a) in FIG. 4; section (b) in FIG. 5 shows a cross-sectional view along the line V—V in section (a) in FIG. 5; and section (b) in FIG. 6 shows a cross-sectional view along the line VI—VI in section (a) in FIG. 6.

Figure 4:
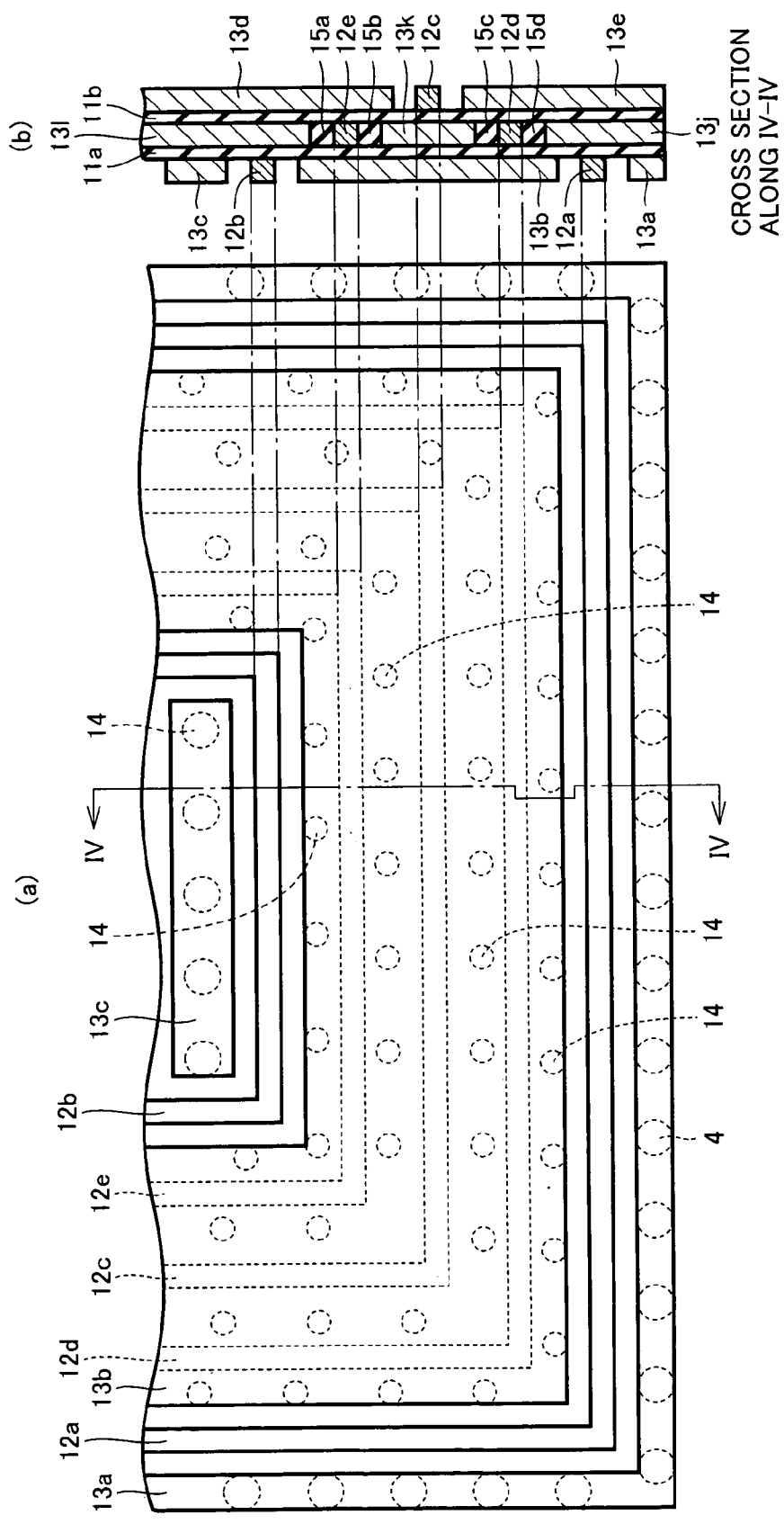
FIG. 4 illustrates a microstrip line in a second embodiment.

The microstrip line shown in FIG. 4 according to the present embodiment includes a dielectric substrate 11a and a dielectric substrate 11b. A signal line 12a and a signal line 12b are provided on an outer main surface of dielectric substrate 11a. Signal line 12a and signal line 12b are parallel to each other. A ground pattern 13b is provided on the outer main surface of dielectric substrate 11a in a region lying between signal lines 12a and 12b. In addition, ground patterns 13a and 13c are provided on the outer main surface of dielectric substrate 11a. Ground patterns 13a, 13b, and 13c extend in parallel to each signal line 12a and 12b.

A signal line 12d and a signal line 12e are provided between dielectric substrate 11a and dielectric substrate 11b. Signal line 12d and signal line 12e are parallel to each other. Adhesive layers 15c and 15d are provided on walls on opposing sides of signal line 12d. Adhesive layers 15c and 15d adhere to dielectric substrates 11a and 11b. In addition, adhesive layers 15a and 15b are provided on walls of opposing sides of signal line 12e. Adhesive layers 15a and 15b adhere to dielectric substrates 11a and 11b. Therefore, adhesive layers 15a, 15b, 15c, and 15d fix a positional relation between dielectric substrates 11a and 11b.

A ground pattern 13k is provided between adhesive layers 15b and 15c and between dielectric substrates 11a and 11b. In addition, a ground pattern 13l is provided between dielectric substrates 11a and 11b, in a portion outside adhesive layer 15a. Moreover, a ground pattern 13j is provided between dielectric substrates 11a and 11b, in a portion outside adhesive layer 15d.

A signal line 12c is provided on an outer main surface of dielectric substrate 11b. In addition, ground patterns 13d and 13e are provided on the outer main surface of dielectric substrate 11b. Signal lines 12a, 12b, 12c, 12d, and 12e are provided in parallel to one another.

Ground patterns 13a, 13b, 13c, 13d, 13e, 13j, 13k, and 13l are electrically connected to one another by a plurality of plugs (through holes) 14 penetrating dielectric substrate 1, so as to implement one conductor.

According to the microstrip line in the present embodiment as described above, the plurality of signal lines are distributed in three layers consisting of a layer on the outer main surface of dielectric substrate 11a, a layer lying between dielectric substrates 11a and 11b, and a layer on the outer main surface of dielectric substrate 1b. According to the microstrip line as above, as compared with an example in which all of the plurality of signal lines are provided on one main surface of one dielectric substrate, an interval between the signal lines in one layer can be larger. Accordingly, a ground pattern provided between the signal lines in one layer can have a larger width. Consequently, prevention of electro-magnetic interference between the signal lines in one layer can be ensured. In addition, according to the structure shown in FIG. 4, for example, ground pattern 13b can have a larger width. As a result, a rib of a shielding conductor connected to ground pattern 13b can have a larger width. Therefore, suppression of interference between signal lines 12a and 12b can further be ensured.

In the structure shown in FIG. 4, in order to implement a microstrip line, a ground pattern is unfailingly provided in a position on the dielectric substrate, opposite to a position on the dielectric substrate where a signal line is provided.

Another microstrip line in the present embodiment will now be described with reference to FIG. 5. The structure of the microstrip line in the present embodiment is substantially similar to that of the microstrip line described with reference to FIG. 4. In addition, portions having the same reference numerals attain substantially similar functions in the microstrip lines shown in FIGS. 4 and 5. The microstrip line shown in FIG. 4 is different from the microstrip line shown in FIG. 5 only in arrangement of a plurality of signal lines.

More specifically, the microstrip line shown in FIG. 5 includes signal lines 12a, 12b, 12f, 12g, and 12h. Signal lines 12a, 12b, 12f, 12g, and 12h are provided in parallel to one another. In addition, ground patterns 13a, 13b, 13c, 13f, 13g, 13h, 13j, and 13l are provided in the microstrip line. The microstrip line structured as shown in FIG. 5 can also attain an effect similar to that obtained by the microstrip line shown in FIG. 4.

FIG. 6 illustrates a structure of yet another microstrip line in the present embodiment. The structure of the microstrip line shown in FIG. 6 is also substantially similar to that of the microstrip line shown in FIG. 5. In addition, portions having the same reference numerals attain substantially similar functions in FIGS. 4 to 6. The structure shown in FIG. 6 is different from that shown in FIG. 5 only in the number and arrangement of a plurality of signal lines.

More specifically, the microstrip line shown in FIG. 6 includes signal lines 12a, 12c, 12d, and 12e. Signal lines 12a, 12c, 12d, and 12e are provided in parallel to one another. In addition, ground patterns 13a, 13b, 13d, 13e, 13j, 13k, and 13l are provided in the microstrip line shown in FIG. 6. Moreover, adhesive layers 15a, 15b, 15c, and 15d are provided in the microstrip line shown in FIG. 6. The microstrip line structured as shown in FIG. 6 can also attain an effect similar to that obtained by the microstrip lines shown in FIGS. 4 and 5.

When neighboring signal lines 12e and 12d are provided in an identical layer as in the microstrip line shown in FIG. 6, an interval between signal lines 12d and 12e in FIG. 6 may extremely be smaller than an interval between other signal lines. On the other hand, the microstrip line shown in FIGS. 4 and 5 can avoid such a disadvantage. That is, if two signal lines in proximity are provided in two different layers respectively as shown in FIGS. 4 and 5, the disadvantage as above is avoided.

Meanwhile, if neighboring signal lines 12d and 12e are provided in an identical layer and opposed to one ground pattern 13a with dielectric substrate 11a being interposed as in the microstrip line shown in FIG. 6, an interval between signal lines 12d and 12e is small whereas an interval between the signal lines in other layers can be larger. Therefore, when it is necessary to reliably prevent electromagnetic interference between specific signal lines, such arrangement of the plurality of signal lines as shown in FIG. 6 may be effective.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A microstrip line comprising:
   a first dielectric substrate having an outer main surface and an inner main surface;
   a second dielectric substrate provided in parallel to said first dielectric substrate, said second dielectric substrate having an outer main surface and an inner main surface;
   an adhesive layer provided between the first and second dielectric substrates and in contact with the inner main surfaces of the first and second dielectric substrates;
   at least one ground conductive layer provided in each of a layer on the outer main surface of the first dielectric substrate, the adhesive layer and a layer on the outer main surface of said second dielectric substrate; and
   at least four signal lines extending in parallel to one another, wherein
   at least one of the at least four signal lines is provided in each of the layer on the outer main surface of the first dielectric substrate, the adhesive layer and the layer on the outer main surface of said second dielectric substrate with the fourth signal line of the at least four signal lines provided in any one of the layer on the outer main surface of the first dielectric substrate, the adhesive layer and the layer on the outer main surface of the second dielectric substrate,
   the ground conductive layers provided in each of the layer on the outer main surface of the first dielectric substrate, the adhesive layer and the layer on the outer main surface of said second dielectric substrate extend in parallel to said at least four signal lines extending in parallel to one another, and
   each signal line provided in the layer on the outer main surface of the first dielectric substrate is opposed to a ground conductive layer provided in the adhesive layer and a ground conductive layer provided in the layer on the outer main surface of the second dielectric substrate, each signal line provided in the adhesive layer is opposed to a ground conductive layer provided in the layer on the outer main surface of the first dielectric substrate and any ground conductive layer provided in the layer on the outer main surface of the second dielectric substrate, and each signal line provided in the layer on the outer main surface of the second dielectric substrate is opposed to any ground conductive layer provided in the adhesive layer and any ground conductive layer provided in the layer on the outer main surface of the first dielectric substrate.

* * * * *